United States Patent [19]
de la Croix Vaubois et al.

[11] Patent Number: 5,508,876
[45] Date of Patent: Apr. 16, 1996

[54] ELECTRONIC INSTALLATION HAVING SEVERAL FUNCTIONAL MODULES PROTECTED AGAINST LIGHTNING BY A SINGLE DISCONNECTABLE PROTECTION MODULE

[75] Inventors: Christine de la Croix Vaubois, Levallois; Jean-Marie Goy, Sainte Genevieve des Bois; Geérard Nemoz, Maisons Alfort, all of France

[73] Assignee: Sextant Avionique, Meudon la Foret, France

[21] Appl. No.: 165,832

[22] Filed: Dec. 14, 1993

[30] Foreign Application Priority Data

Dec. 17, 1992 [FR] France ................... 92 15557

[51] Int. Cl.$^6$ .................................... H02H 3/22
[52] U.S. Cl. ................................ 361/117; 361/118
[58] Field of Search ................. 361/111, 56, 58, 361/91, 117, 118, 119; 439/620, 189

[56] References Cited

U.S. PATENT DOCUMENTS 3,660,726  5/1972  Ammon et al. ............... 317/101
5,224,878  7/1993  Lurie et al. .................. 439/607

FOREIGN PATENT DOCUMENTS 0220677  5/1987  European Pat. Off. .
2209893  5/1989  United Kingdom .

*Primary Examiner*—A. D. Pellinen
*Assistant Examiner*—Michael J. Sherry
*Attorney, Agent, or Firm*—Browdy and Neimark

[57] ABSTRACT

The protective device applies to an installation comprising a rack in which are engaged modular functional elements interconnected by means of an interconnecting circuit provided at the back of the rack. It uses a connector element mounted on the rack and whose connection pins are electrically connected to conductors of the interconnecting circuit, and a protective module comprising a case accommodating protective circuits linked to connection members of a second connector element susceptible of connecting into the first connector element in order to provide a disconnectable electrical link between the conductors and the corresponding protective circuits. The invention applies notably to the protection of the electronic installations situated on board an aircraft.

9 Claims, 2 Drawing Sheets

ELECTRONIC INSTALLATION HAVING SEVERAL FUNCTIONAL MODULES PROTECTED AGAINST LIGHTNING BY A SINGLE DISCONNECTABLE PROTECTION MODULE

BACKGROUND OF THE INVENTION

1. Field of the Invention

This invention relates to a device for the protection of an electronic installation against the interference generated by phenomena affecting the outer environment in which the installation is placed.

It applies notably, though not exclusively, to the protection against lightning, or even electromagnetic interference (EMI), of electronic installations situated on board an aircraft.

2. Description of the Prior Art

It is known that, at present, it is increasingly more common for these installations to have modular structures using racks within which modular functional elements can be engaged in drawer-like fashion.

These modular elements are connected to one another and to the exterior (aircraft links) by means of an interconnecting circuit provided at the back of the rack.

This interconnecting circuit does of course comprise connection elements susceptible of cooperating with corresponding connecting means integrated into each modular element.

Hitherto, these installations were protected (at the user's request) against lightning and electromagnetic interference by means of protective circuits integrated into the electronic circuits of the modular elements.

Experience has proved that this solution has numerous drawbacks.

It firstly requires specific designing of the electronic circuit boards of the modular elements, which will differ depending on whether or not the above-mentioned protection is ensured.

Protection of a modular element not originally protected therefore implies a change of printed circuit board, i.e. a costly intervention that can only be performed by a specialist.

Moreover, in view of the integration thereof into the electronic circuits of the modular elements, protective circuits process interference within the very circuits they are intended to protect, to the extent that, paradoxically, these circuits are even further exposed to these interferences.

Another drawback of this integration consists in that it can be difficult to test these protective circuits.

Furthermore, it so happens that this solution is poorly suited to the solving of heat dissipation problems occurring notably when, subsequent to a stroke of lightning, the excess current running through the protective circuit causes a sudden and intensive temperature rise inside the modular element.

OBJECT OF THE INVENTION

The main object of this invention is particularly to remedy these drawbacks.

SUMMARY OF THE INVENTION

Accordingly, there is provided a protective device using:

on the one hand, a first connector element mounted on the rack and whose connection members are electrically linked to respective conductors of the interconnecting circuit susceptible of constituting vectors of propagation of said interference, and on the other hand, a protective module comprising a case accommodating protective circuits respectively associated with said conductors and electrically linked to connection members of a second connector element susceptible of connecting into the first connector element in order to provide a disconnectable electrical link between said conductors and the corresponding protective circuits.

By means of such a solution, it clearly appears that:

the protection of the modular elements of the electronic installation is performed on the outside of these elements, or even outside the rack, so that the interference is neutralized even before it (directly or indirectly) reaches the electronic circuits to be protected;

the protective elements have no bearing on the structure and design of the electronic circuits of the modular elements. The latter remain identical, with or without protection. By means of this interchangeability, there therefore ensues a greater adaptability and a greater availability of the modular elements;

the protective circuits are confined within an outer case situated in a location where there is no risk of interference with the electronic circuits, since this case, as well as the protective circuit supporting structures, are designed to provide the best possible operating conditions and, in particular, the best possible heat transmission.

BRIEF DESCRIPTION OF THE DRAWINGS

Further features and advantages of the invention will be apparent from an embodiment of the invention described, by way of a non-limiting example, in reference to the corresponding accompanying drawings in which.

DESCRIPTION OF THE PREFERRED EMBODIMENTS

Figure 1:
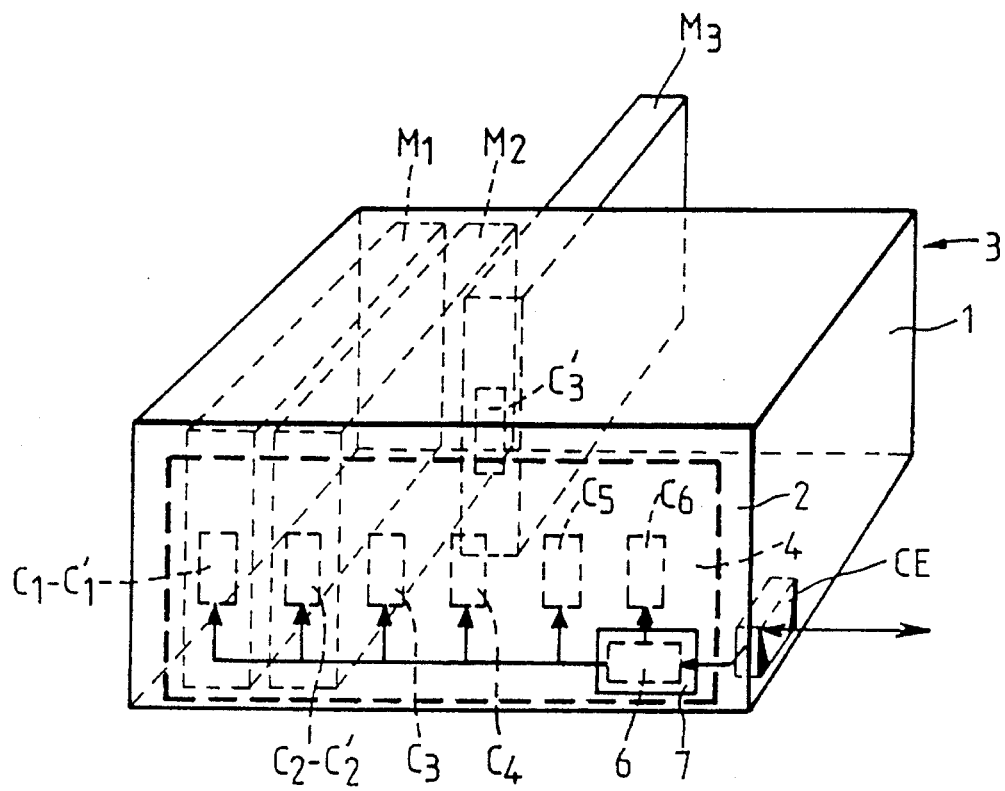
FIG. 1 is a schematic representation showing a perspective rear view of a rack intended to receive modular elements.

In the example represented in FIG. 1, the parallelepiped-shaped rack 1 has a back 2 and, on the side opposite this back, an open front side 3 through which are engaged, in drawer-like fashion, electronic modules $M_1$, $M_2$, $M_3$ which can consist e.g. in computer elements.

Inside the rack 1 is disposed, parallel and close to the back, a printed circuit board 4 serving to interconnect the modules $M_1$, $M_2$, $M_3$ to one another and with the external circuits to which the rack is connected.

This printed circuit board 4 is connected to the electronic modules $M_1$, $M_2$, $M_3$ by means of plug-in connectors $C_1$–$C'_1$, $C_2$–$C'_2$, $C_3$–$C'_3$, $C_4$, $C_5$, $C_6$ respectively provided on said board 4 and on the rear sides of said modules $M_1$, $M_2$, $M_3$.

The interconnecting board 4 and the external circuits are linked, in this instance, by a connector CE provided on one of the lateral sides of the rack 1.

Figure 2:
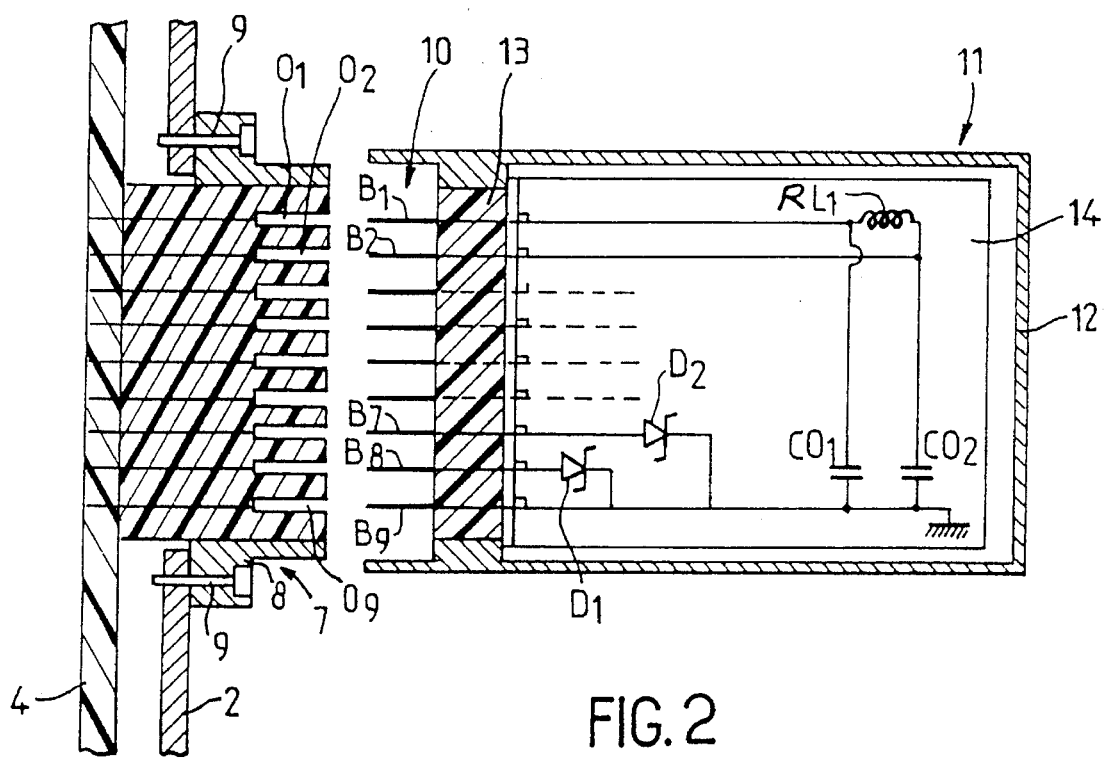
FIG. 2 is a schematic cutaway view illustrating the principle of connection of a connection module to a connector fixed to the back of the rack.
Figure 4:
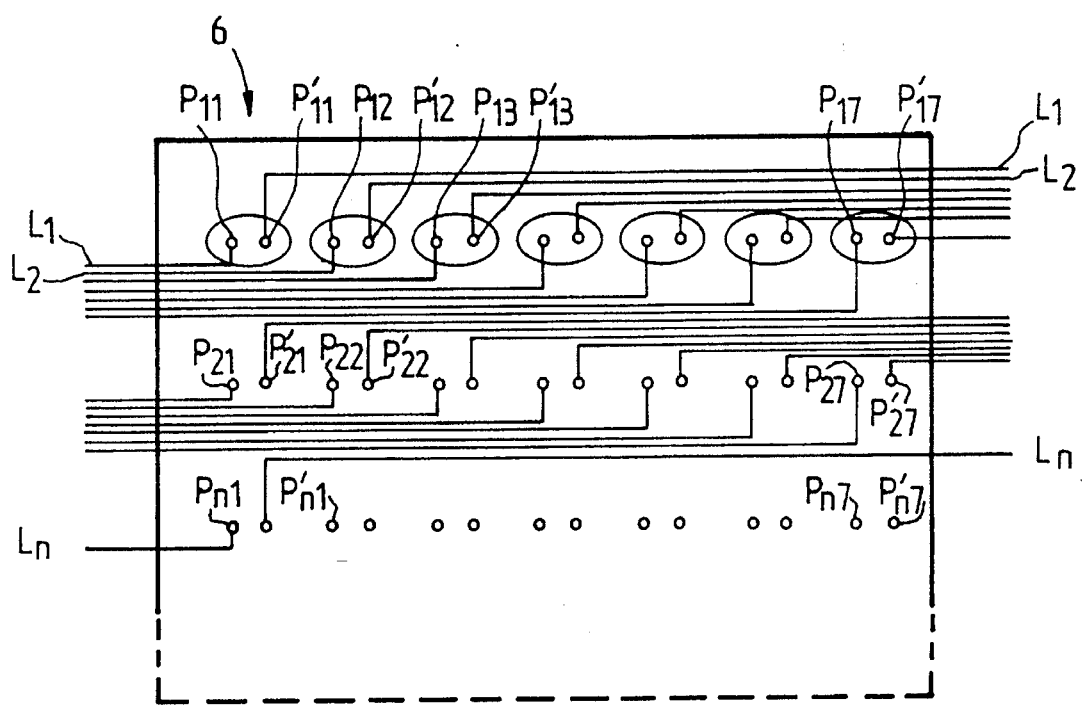
FIG. 4 is a schematic representation of a transfer matrix formed on the interconnecting circuit provided at the back of the rack.

According to the invention, the circuits of the interconnecting board 4, which link the connectors $C_1$ to $C_6$ associated with the modular elements $M_1$, $M_2$, $M_3$ and the connector CE, are disposed so as to form a transfer matrix (block 6), e.g. of the type represented in FIG. 4, of which each of the points $P_{11}$, $P'_{11}$ to $P_{n7}$, $P'_{n7}$ is connected to a connection member of a connector 7 mounted on the back 2 of the rack 1, e.g. in the manner illustrated in FIG. 2.

In this example, the connector 7 comprises a multiplicity of socket-type connection members $O_1$ to $O_9$ mounted on a support insulator 8 and respectively connected to points of the transfer matrix 6 on the interconnecting board 4.

This connector 7, which passes through an orifice made in the back 2 of the rack 1 and which is fastened to the latter by means of screws 9, is intended to receive a pin-type connector 10 interdependent with a protective module 11.

This protective module 11, which constitutes an interchangeable standard block, is comprised of a parallelepiped-shaped metallic or metallized case 12 whose front part is constituted by the pin-type connector 10, the latter comprising a multiplicity of conductive pins $B_1$ to $B_9$ mounted on a support insulator 13 forming the rear wall of the case 12.

Each of these pins $B_1$ to $B_9$ is connected to a protective circuit mounted on a printed circuit board 14 accommodated inside the case 12.

In the example represented in FIG. 2, only three protective circuits of two different types have been represented, i.e. two circuits for protection against lightning, each using a
lightning diode $D_1$, $D_2$ connecting a pin $B_7$, $B_8$ to the ground (pin $B_9$),
one circuit for protection against electromagnetic interference (EMI), comprising an inductive resistor $RL_1$ of which each of the terminals is connected to a respective pin and to the ground, via a capacitor $CO_1$, $CO_2$ in order to obtain a π-type filter.

Of course, each protective circuit can comprise, in combination, a circuit for protection against electromagnetic interference and a circuit for protection against lightning whose lightning diode is connected upstream of the inductive resistor $RL_1$.

Advantageously, the double-sided type board 14 comprises a ceramic or FR4-type chip with, on one edge, two connector bars to which are soldered the pins $B_1$ to $B_9$ and on which the lightning diodes $D_1$, $D_2$ and the filters $RL_1$, $CO_1$, $CO_2$ are assembled in chip-on-board form.

The output and voltage of the diodes $D_1$, $D_2$ (breakdown) can of course be selected from among preselected values. If required, these diodes $D_1$, $D_2$ may be mounted serially.

Likewise, the value of the inductive resistor $RL_1$ and capacitors $CO_1$, $CO_2$ will be determined as a function of the type of interference one wishes to filter.

As it happens, circuits for protection against lightning only require a simple connection at a point $P_{11}$, $P'_{11}$, $P_{n7}$, $P'_{n7}$ on the transfer matrix 6 and this, without having to perform an interruption of the line $L_1$, $L_2$ ... $L_n$ of the interconnecting circuit passing through this point.

Accordingly, when it only comprises circuits for protection against lightning, the protective module 11 can be removed without the disconnection thereof disrupting the operating of the rack 1.

Conversely, circuits for protection against electromagnetic interference require the mounting of the inductive resistor $RL_1$ in series on the line, and therefore an interruption of this line between the two points to which this inductive resistor $RL_1$ is to be connected.

It is obvious that, in this case, the protective module 11 cannot be disconnected without disrupting the operating of the rack 1, and must be followed by an operation aimed at re-establishing the continuity of the lines $L_1$, $L_2$ ... $L_n$ which are then interrupted due to said disconnection.

FIG. 4 shows an example of an embodiment of a transfer matrix 6 suited to protective modules using protective circuits irrespective of whether or not the latter require the interruption of the lines $L_1$, $L_2$ ... $L_n$ to be protected.

This transfer matrix 6 has an area substantially identical to the connection area of the connector 7, and is arranged so as to be crossed by n lines of the interconnecting board 4 one wishes to protect.

In this area, each line $L_1$, $L_2$ ... $L_n$ is interrupted between a couple of points $P_{11}$–$P'_{11}$, $P_{12}$–$P'_{12}$ ... to which are respectively connected two connection members $O_1$ to $O_9$ of the connector 7.

In the case where only protection against lightning is required on a line $L_1$ ... $L_n$, the connection elements $B_1$, $B_9$ of the protective module 11 corresponding to the couple of points $P_{11}$–$P'_{11}$, $P_{12}$–$P'_{12}$ corresponding to this line, are connected to one another by a conductive link (not represented) and to a protective circuit that can comprise a grounded lightning diode $D_1$, $D_2$.

However, in the case where protection against electromagnetic interference is required on a line, the protective elements of the protective module corresponding to the couple of points $P_{11}$–$P'_{11}$, $P_{12}$–$P'_{12}$ corresponding to this line, are connected to one another by inductive resistor L, and to the ground, in relation to two respective capacitors $CO_1$, $CO_2$.

In the case where protection of the rack 1 is not required, it is then necessary to use, instead of a protective module, a connection module designed to ensure an electrical connection between each couple of points $P_{11}$–$P'_{11}$, $P_{12}$–$P'_{12}$ ...

It thus appears that, by means of these dispositions, the user can at all times suppress or re-establish the protections against lightning and/or electromagnetic interference, without having to modify the rack and/or its modular elements, i.e. the protective module 11 need simply be replaced by another protective module, or even by a connection module.

A further advantage of this solution consists in that the protective circuits of the protective modules can be easily tested without having to act on the rack or the elements it contains.

Advantageously, the design of the protective circuits can be a function of the structure of the transfer matrix and of the connectors associated therewith.

Thus, the pins of the connector integrated into the protective module can have a matrix layout similar to that of the transfer matrix.

Figure 3:
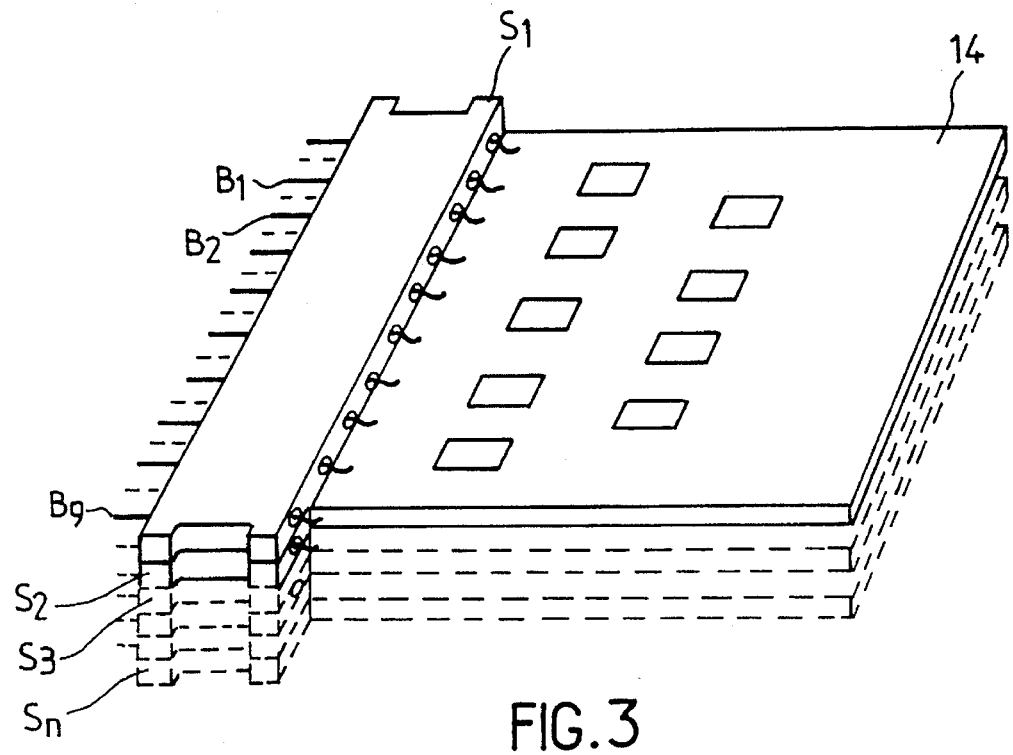
FIG. 3 shows the inner structure of a protective module.

In this case, each line of pins $B_1$ to $B_9$ is mounted on a respective support insulator $S_1$, $S_2$ ... $S_n$ designed so as to be stackable on top of the support insulator assigned to an adjacent line (FIG. 3).

Furthermore, the pins $B_1$ to $B_9$ of a same line of pins are connected to circuits mounted on a same side of a printed circuit board 14 (the circuits on the two sides of the board being respectively connected to the pins mounted on two successive supports $S_1$ ... $S_n$).

By means of such a disposition, the protective module can be easily adapted to the size of the protective connector on the rack.

The flexibility and adaptability of the protective device is thus enhanced.

Its reliability and efficiency can be easily increased due to the fact that the protective modules can be made from the most suitable of materials notably to resist high temperatures and to ensure the necessary heat transfers, notably towards the outside and without risk of damaging the components of the rack and/or of the electronic modules it contains.

We claim:

1. An electronic installation protected against interferences generated by phenomena such as lightning affecting the outer environment in which said installation is placed, said installation comprising a rack in which can be engaged functional modules each comprising a first connector element which can be connected into one of a plurality of second connectors provided on a printed circuit board provided at the back of the rack, said first connector element having a plurality of connecting members connected to an electronic circuit to be protected, located in said module, the second connectors having connecting members interconnected therebetween and with external circuits by a plurality of interconnecting tracks provided on said printed circuit board and which are susceptible of constituting vectors of propagation of said interferences, said installation further comprising a third connector element provided on said printed circuit board and having connection members which are electrically linked to said interconnecting tracks, and a protective module comprising a case accomodating lightning protective circuits respectively associated to said interconnecting tracks, and a fourth connector element having a connection member electrically linked to said protective circuits, said fourth connector element being disconnectably connected into said third connector element in order to provide a disconnectable electrical link between said interconnecting tracks and said lightning protective circuits.

2. The electronic installation as claimed in claim 1, wherein each of said interconnecting tracks comprises a connecting point connected to a connection member of said third connector element, the connecting points of said interconnecting tracks being disposed so as to form a transfer matrix having a plurality of rows of connecting points respectively connected through said third connector element to corresponding rows of connection members of the fourth connector elements which are linked to lightning protection circuits provided on a proper side of a printed circuit board.

3. The electronic installation as claimed in claim 2, wherein said rows of connection members are respectively mounted on a plurality of support insulators stacked on top of one another, and wherein said case contains a plurality of double-sided printed chips of which each side comprises lightning protective circuits electrically connected to a corresponding row of connecting members.

4. The electronic installation as claimed in claim 1, wherein said lightning protective circuits comprise at least one lightning diode connected between the ground and at least one of said connecting points via said third and said fourth connector elements.

5. An electronic installation adapted to be protected against interferences generated by a lightning affecting the outer environment in which said installation is placed, said installation comprising a rack in which can be engaged functional modules each comprising a first connector element which can be connected into one of a plurality of second connectors provided on a printed circuit board provided at the back of the rack, said first connector element having a plurality of connecting members connected to an electronic circuit located in said module, the second connectors having connecting members interconnected therebetween and with external circuits by a plurality of interconnecting tracks provided on said printed circuit board, each of said interconnecting tracks being interrupted between a couple of points respectively connected to two connecting members of a third connector element provided on said printed circuit board, the couple of points of said interconnecting tracks being arranged so as to form a transfer matrix, said installation further comprising a connection and protection module comprising a case which encloses connecting and/or protecting and/or filtering circuits linked to connection members of a fourth connector element provided on said case and disconnectably connected into said third connector element.

6. The electronic installation as claimed in claim 5, wherein the electronic module comprises for each couple of points either a lightning protection circuit, a filtering circuit or a connection circuit, said circuit being connected to said couple of points through said third and said fourth connectors.

7. The electronic installation as claimed in claim 6, wherein said filtering circuit comprises an inductive resistor connected between said couple of points and two capacitors connecting each of said points to the ground.

8. The electronic installation as claimed in claim 6, wherein said fourth connector element comprises several rows of connection members respectively connected to the points of a corresponding row of said transfer matrix through said third connector element, and to protecting or connecting circuits provided on a proper side of a printed circuit board.

9. The elctronic installation as claimed in claim 8, wherein said rows of connection members are respectively mounted on a plurality of support insulators stacked on top of one another, and wherein said case contains a plurality of double-sided printed circuit chips of which each side is electrically connected to a corresponding row of connection members.

* * * * *